United States Patent
Ishii et al.

(10) Patent No.: US 9,035,310 B2
(45) Date of Patent: May 19, 2015

(54) DISPLAY DEVICE

(71) Applicant: Japan Display Inc., Mobara-shi, Chiba (JP)

(72) Inventors: Yoshinori Ishii, Chiba (JP); Daisuke Sonoda, Chiba (JP); Masanao Yamamoto, Mobara (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 13/633,151

(22) Filed: Oct. 2, 2012

(65) Prior Publication Data

US 2013/0099239 A1 Apr. 25, 2013

(30) Foreign Application Priority Data

Oct. 5, 2011 (JP) ................................. 2011-221000

(51) Int. Cl.
| | | |
|---|---|---|
| H01L 29/43 | (2006.01) | |
| H01L 29/78 | (2006.01) | |
| H01L 33/40 | (2010.01) | |
| G09G 1/00 | (2006.01) | |
| H01L 29/423 | (2006.01) | |
| H01L 29/49 | (2006.01) | |
| H01L 27/12 | (2006.01) | |

(52) U.S. Cl.
CPC ........ *H01L 33/40* (2013.01); *G09G 1/00* (2013.01); *H01L 29/42384* (2013.01); *H01L 29/4908* (2013.01); *H01L 27/1244* (2013.01)

(58) Field of Classification Search
CPC ............ H01L 27/1244; H01L 29/4908; H01L 29/42384
See application file for complete search history.

(56) References Cited

U.S. PATENT DOCUMENTS

| | | | |
|---|---|---|---|
| 6,433,842 B1 * | 8/2002 | Kaneko et al. ............... | 349/43 |
| 6,486,494 B2 * | 11/2002 | Jeong et al. ................... | 257/59 |
| 7,635,436 B2 * | 12/2009 | Kim et al. ..................... | 216/23 |
| 2006/0175286 A1 * | 8/2006 | Matsushita et al. ........... | 216/23 |

FOREIGN PATENT DOCUMENTS

| | | |
|---|---|---|
| JP | 6-85257 | 3/1994 |
| JP | 2007-294672 | 11/2007 |

* cited by examiner

*Primary Examiner* — Matthew W Such
*Assistant Examiner* — Scott Stowe
(74) *Attorney, Agent, or Firm* — Lowe Hauptman & Ham, LLP

(57) ABSTRACT

The invention prevents disconnection of data lines that traverse two-layered gate lines via an insulating film.
Data lines 20 override and thereby traverse gate lines 10 with an insulating film deposited therebetween. The gate lines 10 each have a two-layered structure including a lower AlCu layer 11 and an upper MoCr layer 12. When the thickness ratio of the upper layer 12 to the lower layer 11 is in the range of 0.4 to 1.0, it is possible to prevent a decrease in the etch speed of the upper layer 12 near the side edges of the gate line 10, which occurs due to galvanization. As a result, the upper layer 12 is prevented from having an overhang. The absence of overhangs on the gate lines 10 prevents the data lines 20 from being disconnected at the intersections of the gate lines 10 and the data lines 20.

4 Claims, 5 Drawing Sheets

MoCr-LAYER THICKNESS/AlCu-LAYER
THICKNESS = 60 nm/100 nm
THICKNESS RATIO: 0.6

MoCr-LAYER THICKNESS/AlCu-LAYER
THICKNESS = 100 nm/140 nm
THICKNESS RATIO: 0.71

MoCr-LAYER THICKNESS/AlCu-LAYER
THICKNESS = 80 nm/100 nm
THICKNESS RATIO: 0.8

MoCr-LAYER THICKNESS/AlCu-LAYER
THICKNESS = 100 nm/100 nm
THICKNESS RATIO: 1.0

DISPLAY DEVICE

CLAIM OF PRIORITY

The present application claims priority from Japanese Patent Application JP 2011-221000 filed on Oct. 5, 2011, the content of which is hereby incorporated by reference into this application.

BACKGROUND OF THE INVENTION

1. Field of the Invention

The present invention relates to display devices in general and more particularly to display devices capable of preventing the disconnection of data lines resulting from irregular side edges of gate lines.

2. Description of the Related Art

A typical liquid crystal display (LCD) includes the following components: a TFT substrate in which pixel electrodes and thin film transistors (TFTs) are arranged in the form of a matrix; a counter substrate that faces the TFT substrate and includes color filters that face the pixel electrodes of the TFT substrate; and a liquid crystal panel placed between the TFT substrate and the counter substrate. Such a LCD produces an image by controlling the light transmittance of the liquid crystal molecules on a pixel-by-pixel basis.

Because LCDs are flat and lighter in weight, their application is wide: they are used as large-sized televisions, cell phone displays, DSC (Digital Still Camera) displays, and so on. Although LCDs in general have problems with viewing angles (meaning how an image looks differs depending on the viewing angle), IPS (In-Plane Switching) LCDs offer wider viewing angles.

In a LCD, gate lines extend in a first direction and are arranged in a second direction while data lines extend in the second direction and are arranged in the first direction. Pixels are each formed within one of the regions surrounded by the gate lines and the data lines. The data lines override and thereby traverse the gate lines with an insulating layer deposited therebetween.

When a side edge of a gate line is steep or has a reverse taper, a cross section of an insulating film to be deposited over the gate line becomes irregular. This in turn results in disconnection of a data line to be formed on the insulating film. In relation to this, JP-A-1994-85257 discloses a method of preventing damage to an insulating layer protecting a channel protective layer. To achieve that purpose, the channel protective layer, which covers the channel region of a TFT, is shaped to have two insulating layers. In addition, the etch speed of the upper layer is made larger so that the channel protective layer can have a taper at its side edge.

SUMMARY OF THE INVENTION

To achieve reduced electrical resistance, the gate lines of a display device are often formed of an Al alloy. Examples include AlNd and AlCu. AlCu is smaller in electrical resistance than AlNd. Al, however, tends to generate hillocks when it is used as the material of a gate line. Hillocks may break and damage an insulating film when the film is deposited over the gate line. Thus, to prevent such damage to the insulating film, the gate line also includes, in addition to the Al-alloy layer, a cap layer formed of a high-melting metal such as MoCr and the like. The Al-alloy layer and the cap layer are hereinafter referred to as the 'lower layer' and the 'upper layer,' respectively.

To form the gate line, the lower and upper layers are first deposited by sputtering. The lower and upper layers are then subjected to photolithography to form patterns on them. After photoresist development, the lower and upper layers are simultaneously subjected to etching with the use of the same etching solution. FIG. 10 illustrates a cross section of the gate line after photoresist removal. Note that FIG. 10 was obtained by using AlCu for the lower layer and MoCr for the upper layer.

As illustrated in FIG. 10, the lower AlCu layer 11 has a tapered shape, and the upper MoCr layer 12 has an overhang 150. The reason the overhang 150 was produced is that the upper MoCr layer 12 had a smaller amount of its own side portions etched away than an upper section of the AlCu layer 11. Thus, when a gate insulating film 102 is deposited over the gate line 10 as illustrated in FIG. 11, the cross-sectional shape of the gate insulating film 102 becomes irregular due to the overhang 150 of the upper MoCr layer 12. More specifically, a concave portion or a slit 250 is formed on the gate insulating film 102. As illustrated in FIG. 11, this slit 250 extends downward up to the position below the overhang 150 of the upper layer 12. As also illustrated in the cross section of FIG. 11, a data line 20 traverses the gate line 10 in a direction perpendicular to the gate line 10.

As shown in FIG. 11, the gate insulating film 102 is not properly formed near the overhang 150 and has the slit 250. Thus, when the data line 20 is formed on the gate insulating film 102 by sputtering, the material of the data line 20 cannot be sputtered into the slit 250, making the data line 20 discontinuous. Even if the data line 20 has been made continuous across the slit 250 of the gate insulating film 102, the part of the data line 20 that has been deposited over the slit 250 is smaller in thickness. In that case, the data line 20 would be cut off by the heat of electric current when the current flows through the data line 20.

As illustrated in FIG. 12, a possible anti-disconnection measure for preventing disconnection of the data line 20 is to form a-Si layers 1035 at the intersections of the data line 20 and gate lines, so that the data line 20 can extend over the a-Si layers 1035. With this method, the uneven ups and downs along which the data line 20 extends can be lessened. Note that the semiconductor layers 103 of FIG. 12 are a-Si layers each constituting a TFT, and the a-Si layers 1035 are, as stated above, a-Si semiconductor seat sections provided at the intersections of the data line 20 and the gate lines. The problem with this method, however, is that the presence of the a-Si layers 1035 between the data line 20 and the gate lines reduces light transmittance.

An object of the present invention is thus to prevent gate lines (i.e., gate electrodes) each comprising a lower Al-based layer and an upper Mo-based layer from forming an overhang at the upper layer during etching and thereby prevent disconnection of data lines as well.

To solve the above issues, the invention provides the following means.

(1) A display device comprising: gate lines extending in a first direction and arranged in a second direction; data lines extending in the second direction and arranged in the first direction; and TFTs and pixel electrodes each formed within one of the regions surrounded by the gate lines and the data lines, wherein the TFTs are bottom-gate TFTs, wherein each of the gate lines comprises a lower layer formed of an Al-based alloy and an upper layer formed of a Mo-based alloy, and wherein the thickness ratio of the upper layer to the lower layer is in the range of 0.4 to 1.0.

(2) The display device of (1), wherein the thickness ratio of the upper layer to the lower layer is in the range of 0.6 to 1.0.

(3) The display device of (1) or (2), wherein the upper layer is formed of a MoCr alloy and the lower layer is formed of an AlCu alloy.

(4) The display device of (3), wherein the upper layer is 40 nm thick or more.

In accordance with the present invention, a display device that has two-layered gate lines is prevented from forming overhangs at the side edges of the upper layers of the gate lines. This in turn prevents disconnection of data lines at the intersections of the gate lines and the data lines, which may otherwise be caused by irregular side edges of the gate lines.

DESCRIPTION OF THE PREFERRED EMBODIMENTS

An embodiment of the present invention will now be described in detail with reference to the accompanying drawings.

Embodiment 1

Figure 1:
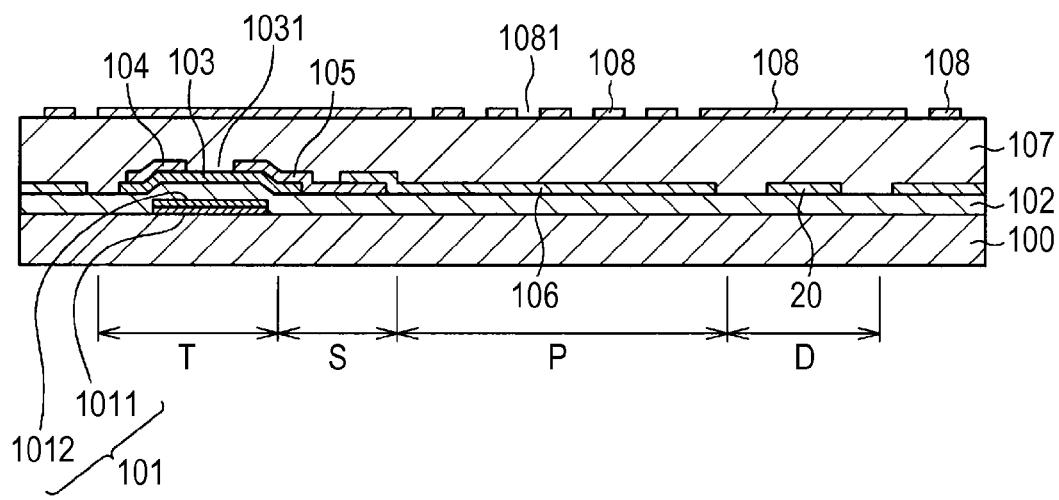
FIG. 1 is a cross section of a LCD to which the invention is applied.
Figure 2:
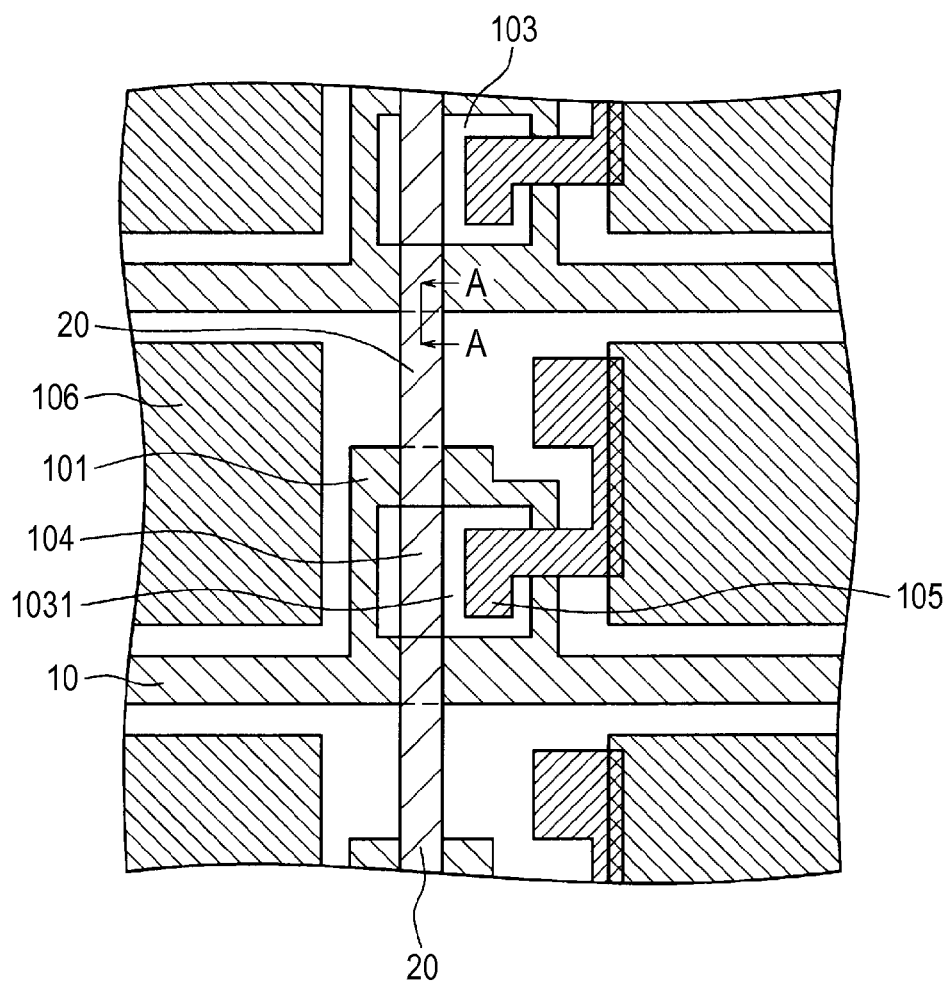
FIG. 2 is a top phantom view illustrating several pixel regions of the LCD.

FIG. 1 is a cross section of a portion of a liquid crystal display (LCD) device to which the invention is applied. LCDs generally have problems with viewing angles, but IPS (In-Plane Switching) liquid crystal displays offer wider viewing angles. While there are several types of IPS LCDs in terms of structure, the display of FIG. 1 is of the IPS-Lite type. FIG. 2 is a top phantom view illustrating the structure of the IPS-Lite LCD, particularly showing pixel electrodes and the components below the pixel electrode layer. While the description of the present embodiment below is based on the assumption that the invention is applied to an IPS-Lite LCD, the application of the present invention is not limited to IPS-Lite LCDs.

As illustrated in FIG. 1, a gate electrode 101 is formed on a TFT substrate 100. The gate electrode 101 is a wider section of the gate line 10 of FIG. 2. In order to achieve reduced electrical resistance, the gate line 10 (i.e., the gate electrode 101) has a two-layered structure including a lower layer 1011 and an upper layer 1012. The lower layer 1011 is formed of an Al-based alloy (90 percent or more of which is Al components), and the upper layer 1012 is formed of a Mo-based alloy (90 percent or more of which is Mo components). In the present embodiment, the lower layer 1011 is formed of AlCu and the upper layer 1012 of MoCr. The proportion of the Cu in the AlCu is less than 2.0% (preferably more than 0.4% but less than 1.0%), and the proportion of the Cr in the MoCr is less than 5.0% (preferably more than 2.0% but less than 3.0%).

As illustrated in FIG. 1, a gate insulating film 102 is formed over the gate electrode 101 (i.e., the gate line 10), and an a-Si semiconductor layer 103 is deposited on the gate insulating film 102. Located on the semiconductor layer 103 are a drain electrode 104 and a source electrode 105. Furthermore, a channel region 1031 is formed between the source electrode 105 and the drain electrode 104. The above-mentioned components jointly form a TFT (thin film transistor). This TFT is often called a bottom-gate TFT since the gate electrode 101 is located below the semiconductor layer 103. As illustrated in FIG. 2, the drain electrode 104 serves also as a data line 20. The source electrode 105 lies within a pixel area including a pixel electrode 106 and is connected to the pixel electrode 106. The pixel electrode 106 is a transparent flat electrode formed of ITO (Indium Tin Oxide). In FIG. 1, the data line 20 exists between the pixel electrode 106 and another pixel electrode. The data line 20 (i.e., the drain electrode 104) and the source electrode 105 are fabricated simultaneously with the same process.

The TFT, the pixel electrode 106, and the data line 20 are covered from above with an inorganic passivation film 107. Formed on the passivation film 107 is a counter electrode 108 having slits 1081. The counter electrode 108 is a single flat ITO electrode and has the slits 1081 formed at the locations facing the pixel electrode 106. When a data signal is applied through the TFT to the pixel electrode 106, an electric field is created between the pixel electrode 106 and the counter electrode 108 via the slits 1081. This electric field changes the orientation of the liquid crystal molecules to change the transmittance of the liquid crystal layer, thereby producing an image. The letter 'T' of FIG. 1 denotes a TFT region, 'S' a source electrode region, 'P' a pixel electrode region, and ° D' a data line region.

FIG. 2 is a top phantom view illustrating the structure of the IPS-Lite LCD of FIG. 1, particularly showing several pixel electrodes 106 and the components below the pixel electrode layer. In FIG. 2, the counter electrode 108 with the slits 1081 is not illustrated for the sake of clarity. It should also be noted that FIGS. 1 and 2 are both enlarged from the actual size but at different rates.

As illustrated in FIG. 2, gate lines 10 extend in a lateral direction and are aligned in a vertical direction. The wider sections of the gate lines 10 act as the gate electrodes 101 of TFTs. Data lines 20, in contrast, extend in a vertical direction and are aligned in a lateral direction. The data lines 20 act also as the drain electrodes 104 of TFTs.

An a-Si semiconductor layer 103 is deposited over each of the gate electrodes 101, the wider sections of the gate lines 10. A drain electrode 104, part of a data line 20, is formed on one side of this semiconductor layer 103, and a source electrode 105 is formed on the opposite side with a channel section 1031 located therebetween. The source electrode 105 lies within a pixel area including a pixel electrode 106 and is connected to the pixel electrode 106. The pixel electrode 106 is a flat electrode formed of ITO (Indium Tin Oxide). The counter electrode 108 with the slits 1081 is placed over the pixel electrode 106 via the inorganic passivation film 107.

Figure 3:
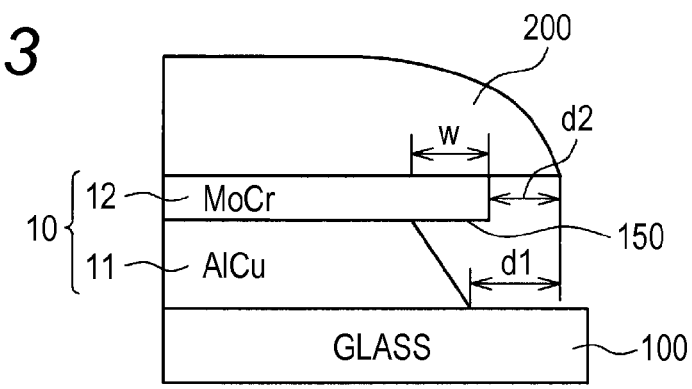
FIG. 3 is a cross section of a two-layered gate line according to a prior-art example.

As already stated, the gate lines 10 have a two-layered structure (the word 'gate lines 10' is hereby meant to include the gate electrodes 101). Thus, when etching causes the upper layer 1012 of a gate line 10 to have an overhang, there are higher chances of the data line 20 above that gate line 10 being cut off. FIG. 3 is a cross section taken from line A-A of FIG. 2, illustrating a prior-art example. Note that in FIG. 3, a photoresist 200 still remains attached, and a lower layer 11 is formed of AlCu and an upper layer 12 of MoCr.

Normally the etch speed of MoCr is higher than that of AlCu. However, at the time of etching, galvanization occurs between the lower AlCu layer 11 and the upper MoCr layer 12, making the etch speed of the MoCr lower than that of the AlCu. More specifically, a portion of the lower AlCu layer 11 closer to the upper MoCr layer 12 increases in etch speed. This results in the lower AlCu layer 11 tapering at its side edge as in FIG. 3. Consequently, the upper MoCr layer 12 is likely to have an overhang 150.

As illustrated in FIG. 3, the distance d1 from the edge of the photoresist 200 to the bottom edge of the lower AlCu layer 11 is larger than the distance d2 from the edge of the photoresist 200 to the edge of the upper MoCr layer 12. This seems to be due to galvanization, which lowers the etch speed of the MoCr.

Figure 10:
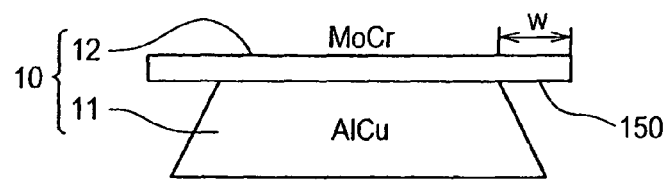
FIG. 10 is a cross section of a two-layered gate line according to a prior-art example.
Figure 11:
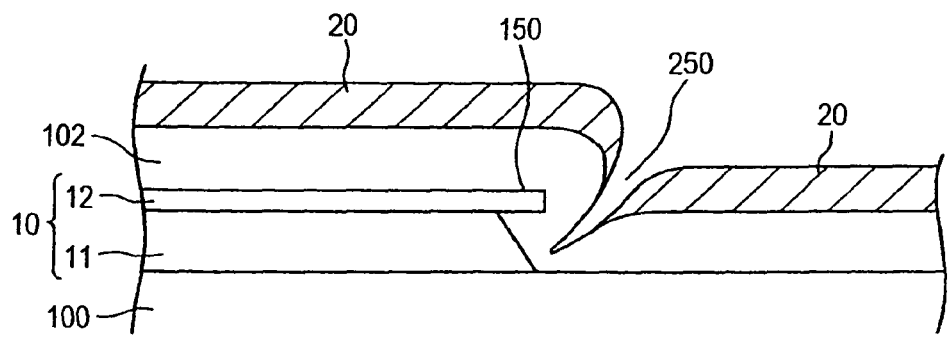
FIG. 11 is a cross section illustrating the disconnection of a data line at the intersection of the data line and a prior-art two-layered gate line.
Figure 12:
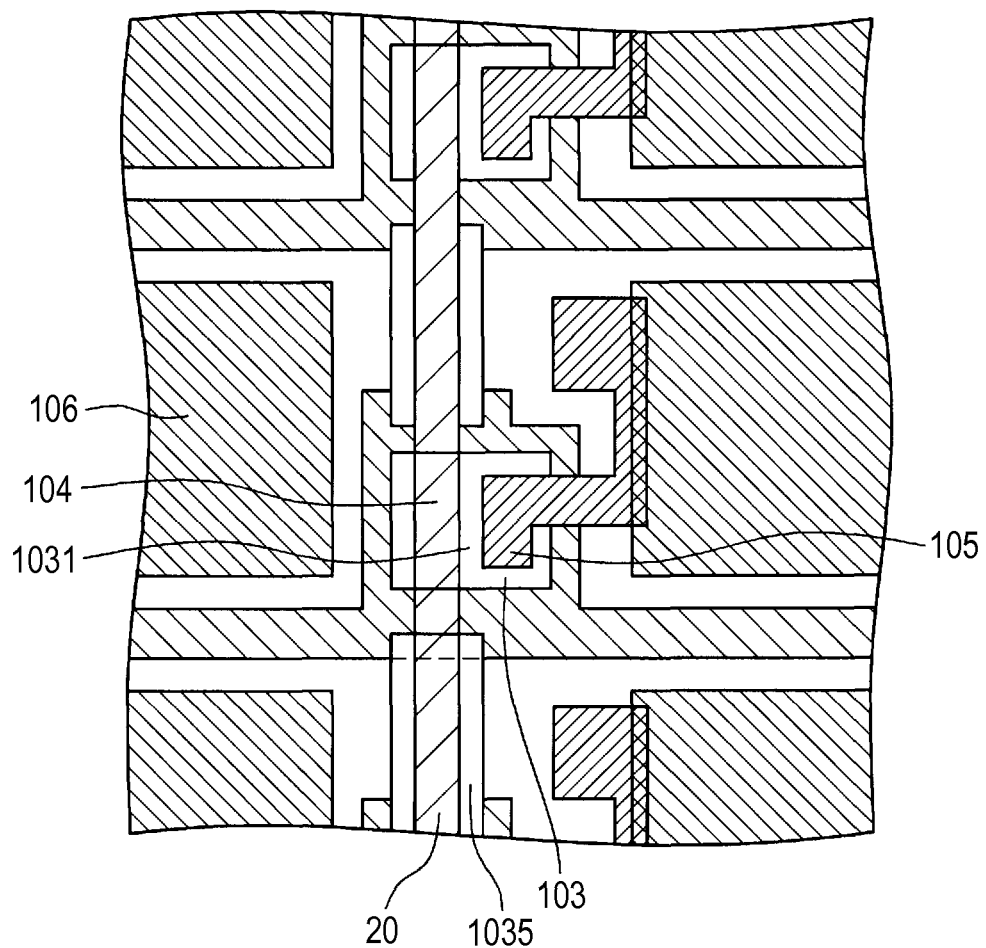
FIG. 12 is a top view illustrating a prior art example in which a-Si seat sections are formed at the intersections of gate lines and a data line in order to lessen the height unevenness across the path of the data line and thereby prevent disconnection of the data line.

When the photoresist 200 of FIG. 3 is removed with MEA (monoethanolamine), a cross section of the gate line 10 is shaped like the one of FIG. 10. When a gate insulating film 102 is subsequently deposited on this gate line 10, a slit 250 is produced below the overhang 150, as illustrated in FIG. 11. Thus, forming a data line 20 over the gate insulating film 102 results in disconnection of the data line 20 as in FIG. 11.

Figure 4:
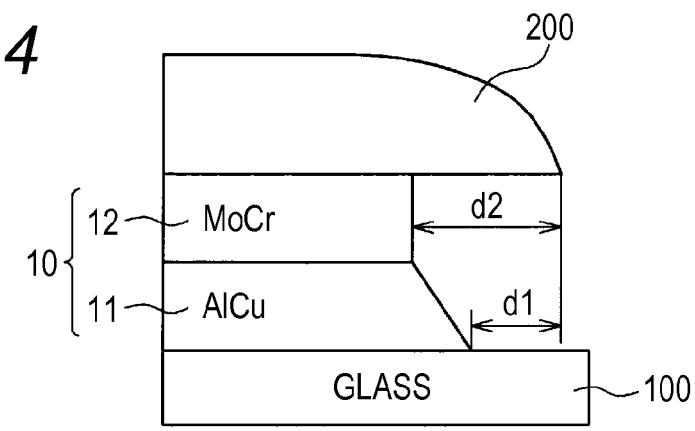
FIG. 4 is a cross section of a two-layered gate line according to the invention.

Applicants have found that such occurrence of the overhang 150 at the upper MoCr layer 11 due to galvanization can be avoided by controlling the thickness ratio of the upper layer 12 to the lower layer 11. FIG. 4 is a cross section of a gate line 10 obtained with the use of the present invention. FIG. 4 was also taken from line A-A of FIG. 2, with the photoresist 200 remaining attached. In FIG. 4, the thickness ratio of the upper MoCr layer 12 to the lower AlCu layer 11 is 1:1.

With this ratio, the occurrence of the overhang 150 due to galvanization is prevented. As illustrated in FIG. 4, the distance d1 from the edge of the photoresist 200 to the bottom edge of the AlCu layer is smaller than the distance d2 from the edge of the photoresist 200 to the edge of the MoCr layer. This might be the exhibition of the natural characteristics of the AlCu and MoCr since the etch speed of the MoCr is normally larger than that of the AlCu.

In FIG. 4, a portion of the AlCu layer 11 closer to the MoCr layer 12 has the same etch speed as the MoCr layer 12 and at the same time has a higher etch speed than a bottom portion of the AlCu layer 11. It seems that this increased etch speed of the AlCu layer 11 near the boundary between the two layers 11 and 12 is due to galvanization occurring at that boundary. This galvanization effect causes a cross section of the lower AlCu layer 11 to taper at its side edge as illustrated in FIG. 4, increasing the coverage of an insulating film to be deposited over the taper. As a result, a data line to be formed over the insulating film can be prevented from being disconnected.

Figure 5:
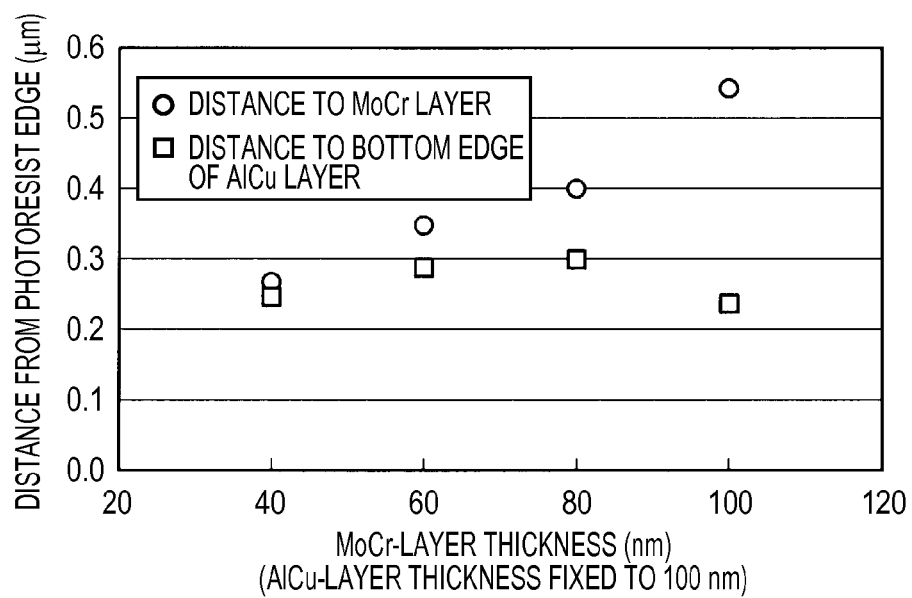
FIG. 5 is a graph showing the distance from a photoresist edge to the upper layer of a two-layered gate line or the distance from the photoresist edge to a bottom edge of the lower layer of the gate line, in which the thickness of the upper layer is varied.

FIG. 5 is a graph showing the distances from the edge of the photoresist 200 of FIG. 3 or 4, in which the thickness of the upper MoCr layer 12 was varied with the thickness of the lower AlCu layer 11 fixed to 100 nm. The vertical axis of FIG. 5 represents the distances (μm) from the photoresist edge. In FIG. 5, each circle denotes the distance d2 of FIG. 3 or 4, and each square denotes the distance d1 of FIG. 3 or 4, that is, the distance from the edge of the photoresist 200 to the bottom edge of the AlCu layer 11.

As shown in FIG. 5, when the thickness of the upper MoCr layer 12 is 40 nm, the distance from the edge of the photoresist 200 to the edge of the upper MoCr layer 12 is equal to the distance from the edge of the photoresist 200 to the bottom edge of the lower AlCu layer 11 (i.e., d2=d1). In this case, the upper MoCr layer 12 has an overhang, but the width w of this overhang is smaller than that of the overhang 150 of FIG. 3 (prior-art example). An overhang of such a width results in the formation of a smaller slit near the gate line 10 when a gate insulating film 102 is deposited over the gate line 10. Accordingly, a data line 20 to be formed on the gate insulating film 102 can be prevented from being disconnected.

As also shown in FIG. 5, when the thickness of the upper MoCr layer 12 increases, the distance d2 from the edge of the photoresist 200 to the edge of the MoCr layer 12 increases accordingly. On the other hand, the distance d1 from the edge of the photoresist 200 to the bottom edge of the lower AlCu layer 11 only slightly increases when the thickness of the MoCr layer 12 is increased up to 80 nm; the distance d1 decreases when the MoCr-layer thickness exceeds 80 nm.

In other words, when the MoCr-layer thickness exceeds 40 nm, the distance d2 increases more than the distance d1 does. Accordingly, the overhang of the upper MoCr layer 12 decreases in width w. This in turn reduces the size of a slit produced on a gate insulating film 102 when the insulating film 102 is deposited over the gate line 10. As a result, a data line 20 to be formed on the gate insulating film 102 is less likely to be disconnected.

As illustrated in FIG. 5, when the thickness of the upper MoCr layer 12 is increased up to 100 nm, the distance d2 from the edge of the photoresist 200 to the edge of the MoCr layer 12 also increases, but the distance d1 from the photoresist edge to the bottom edge of the lower AlCu layer 11 decreases. Thus, when the MoCr layer is 100 nm thick, it has no overhang as in FIG. 4. On the other hand, the lower AlCu layer 11 continues to have a tapered shape. Therefore, the probability of the data line 20 being disconnected is considerably small.

To summarize the above, when the thickness ratio of the upper layer 12 to the lower layer 11 is 0.4 (40-nm thick MoCr/100-nm thick AlCu), the width w of the overhang of the MoCr layer 12 is in an acceptable range. Note however that because an Al alloy is used as the material of the lower layer 11 for the purpose of achieving reduced electrical resistance of the gate line 10, increasing the thickness ratio too much makes it impossible to achieve that purpose. Thus, it is preferred that the thickness ratio of the upper MoCr layer 12 to the lower AlCu layer 11 be in the range of 0.4 to 1.0.

Figure 6:
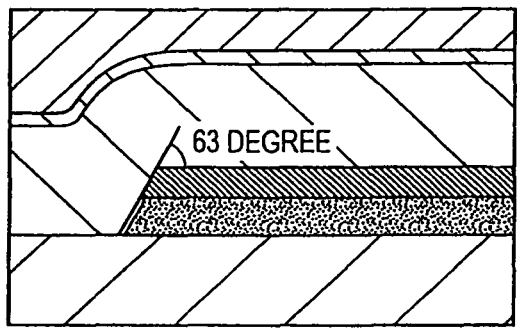
FIG. 6 is a cross section of a gate line obtained when its upper layer/lower layer thickness ratio is 0.6.

FIGS. 6 to 9 are comparative cross-sectional pictures illustrating the angles of the tapers formed at the side edge of the gate line 10 when the thickness ratio of the upper layer 12 to the lower layer 11 was varied. The smaller the taper angle of the gate line 10, the less chance of disconnection of the data line 20 that traverses the gate line 10 via a gate insulating film. In other words, what is preferred is both a small overhang width w and a small taper angle. FIG. 6 was obtained by setting the thickness of the upper MoCr layer 12 to 60 nm and the thickness of the lower AlCu layer 11 to 100 nm (i.e., the thickness ratio of the upper layer to the lower layer=0.6). In FIG. 6, the upper MoCr layer 12 has too small an overhang to observe, and the angle of the taper formed across the side edges of the lower layer 11 and the upper layer 12 is 63 degrees. As illustrated in FIG. 6, the gate insulating layer 102 was properly formed over the gate line 10, even at the side edge of the gate line 10. Thus, a data line 20 to be formed over the insulating film 102 can be prevented from being disconnected.

Figure 7:
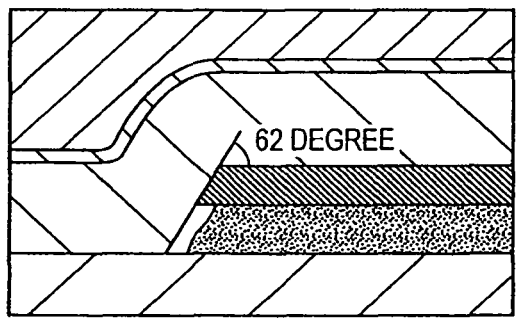
FIG. 7 is a cross section of a gate line obtained when its upper layer/lower layer thickness ratio is 0.71.

FIG. 7 was obtained by setting the thickness of the upper MoCr layer 12 to 100 nm and the thickness of the lower AlCu layer 11 to 140 nm (i.e., the thickness ratio of the upper layer to the lower layer=0.71). In FIG. 7 as well, the upper MoCr layer 12 has too small an overhang to observe. It should be noted that in FIG. 7, the blurred white streak at the lower layer 11 is due to noise, not representing the side edge of the lower AlCu layer 11. In FIG. 7, the angle of the taper formed across the side edges of the lower layer 11 and the upper layer 12 is 62 degrees, slightly lower than in FIG. 6. As illustrated in FIG. 7, the gate insulating layer 102 was properly formed over the gate line 10, even at the side edge of the gate line 10. Thus, a data line 20 to be formed over the insulating film 102 can be prevented from being disconnected.

Figure 8:
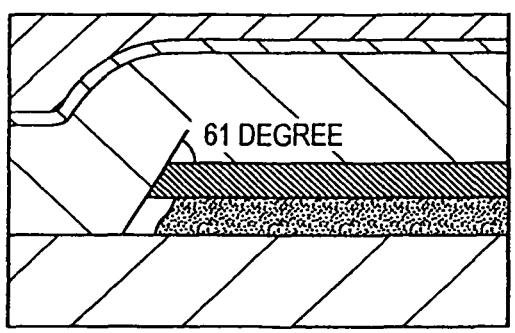
FIG. 8 is a cross section of a gate line obtained when its upper layer/lower layer thickness ratio is 0.8.

FIG. 8 was obtained by setting the thickness of the upper MoCr layer 12 to 80 nm and the thickness of the lower AlCu layer 11 to 100 nm (i.e., the thickness ratio of the upper layer to the lower layer=0.8). In FIG. 8 as well, the upper MoCr layer 12 has too small an overhang to observe. It should be noted that in FIG. 8, the blurred white streak at the lower layer 11 is due to noise, not representing the side edge of the lower AlCu layer 11. In FIG. 8, the angle of the taper formed across the side edges of the lower layer 11 and the upper layer 12 is 61 degrees, slightly lower than in FIG. 7. As illustrated in FIG. 8, the gate insulating layer 102 was properly formed over the gate line 10, even at the side edge of the gate line 10. Thus, a data line 20 to be formed over the insulating film 102 can be prevented from being disconnected.

Figure 9:
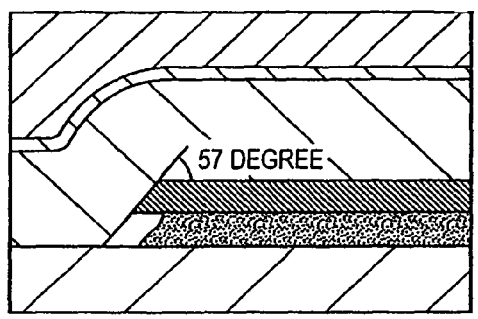
FIG. 9 is a cross section of a gate line obtained when its upper layer/lower layer thickness ratio is 1.0.

FIG. 9 was obtained by setting the thickness of the upper MoCr layer 12 to 100 nm and the thickness of the lower AlCu layer 11 to 100 nm (i.e., the thickness ratio of the upper layer to the lower layer=1.0). In FIG. 9 as well, the upper MoCr layer 12 has too small an overhang to observe. It should be noted that in FIG. 9, the blurred white streak at the lower layer 11 is due to noise, not representing the side edge of the lower AlCu layer 11. In FIG. 9, the angle of the taper formed across the side edges of the lower layer 11 and the upper layer 12 is 57 degrees, slightly lower than in FIGS. 6 to 8. As illustrated in FIG. 9, the gate insulating layer 102 was properly formed over the gate line 10, even at the side edge of the gate line 10. Thus, a data line 20 to be formed over the insulating film 102 can be prevented from being disconnected.

As is obvious from FIGS. 6 to 9, when the thickness ratio of the upper layer 12 to the lower layer 11 is equal to or greater than 0.6, the overhang width w of the upper MoCr layer 12 is considerably small. That thickness ratio also allows the angle of the taper formed at the edge of the gate line 10 to fall to 63 degrees or lower, a desirable range. Further, as already stated with reference to FIG. 5, when the thickness ratio is 0.4 or greater, the overhang width w is in an acceptable range. Therefore, the thickness ratio of the upper layer 12 to the lower layer 11 should be in the range of 0.4 to 1.0, or preferably in the range of 0.6 to 1.0.

As above, we have discussed the thickness ratio of the two layers of the gate line 10, or the thickness ratio of the upper MoCr layer 12 to the lower AlCu layer 11, and how it influences the overhang width w of the upper MoCr layer 12 and the taper angle of the gate line 10. The above discussion also applies to the case where the upper layer 12 is formed of an alloy 90 percent or more of which is Mo, and the lower layer 11 is formed of an alloy 90 percent or more of which is Al. Further, while the above discussion is based on the assumption that the present invention is applied to an IPS-Lite LCD, the invention can also be applied to other IPS LCDs or non-IPS LCDs that adopt bottom-gate TFTs. Moreover, while the above embodiment assumes the use of a mixed acid solution formed of phosphoric acid (main component) and of another acid such as nitric acid or acetic acid as the etching solution to form the gate line 10, no particular limitation is placed on the kind of the etching solution. It should further be noted that the present invention can be applied not only to liquid crystal displays but to various displays as well including organic electroluminescence displays. Moreover, the present invention can be applied not only to gate lines but to other lines including data lines or to transistor electrodes, without departing from the scope of the invention.

What is claimed is:

1. A display device comprising:
   gate lines extending in a first direction and arranged in a second direction;
   data lines extending in the second direction and arranged in the first direction so as to intersect the gate lines and having a gate insulation layer therebetween; and
   TFTs and pixel electrodes each formed within one of the regions surrounded by the gate lines and the data lines,
   wherein the TFTs are bottom-gate TFTs,
   wherein each of the gate lines comprises a lower layer formed of an AlCu alloy having a first thickness and an upper layer formed of a MoCr alloy having a second thickness,
   wherein a relationship of the second thickness of the upper layer of the MoCr alloy of the gate line to the first thickness of the lower layer of the AlCu alloy of the gate line has a thickness ratio which avoids formation of an overhang of the upper layer of the MoCr alloy over the lower layer of the AlCu alloy of the gate line due to galvanization, and which overhang enables formation of a disconnection of the data line in a region of an intersection of the data line and the gate line, the thickness ratio of the second thickness of the upper layer of the MoCr alloy to the first thickness of the lower layer of the AlCu alloy being within a range of 0.4 to 1.0.

2. The display device of claim 1, wherein the thickness ratio of the upper layer of the MoCr alloy to the lower layer of the AlCu alloy is within the range of 0.6 to 1.0.

3. The display device of claim 1, wherein the upper layer of the MoCr alloy has the second thickness of a minimum thickness of 40 nm.

4. The display device of claim 1, wherein the MoCr alloy of the upper layer is at least 90% Mo, and the AlCu alloy of the lower layer is at least 90% Al.

* * * * *